US008017435B2

(12) United States Patent
Leib et al.

(10) Patent No.: US 8,017,435 B2
(45) Date of Patent: Sep. 13, 2011

(54) METHOD FOR PACKAGING ELECTRONIC DEVICES AND INTEGRATED CIRCUITS

(75) Inventors: Juergen Leib, Freising (DE); Hidefumi Yamamoto, Takatsuki (JP)

(73) Assignee: Wafer-Level Packaging Portfolio LLC, Cupertino, CA (US)

( * ) Notice: Subject to any disclaimer, the term of this patent is extended or adjusted under 35 U.S.C. 154(b) by 50 days.

(21) Appl. No.: 12/307,174

(22) PCT Filed: Jun. 1, 2007

(86) PCT No.: PCT/EP2007/004847
§ 371 (c)(1),
(2), (4) Date: Nov. 5, 2009

(87) PCT Pub. No.: WO2008/009328
PCT Pub. Date: Jan. 24, 2008

(65) Prior Publication Data
US 2010/0059877 A1 Mar. 11, 2010

(30) Foreign Application Priority Data

Jul. 15, 2006 (DE) .......................... 10 2006 032 925

(51) Int. Cl.
*H01L 21/00* (2006.01)
*H01L 23/495* (2006.01)
(52) U.S. Cl. ........ 438/106; 438/121; 438/125; 257/678; 257/684; 257/692; 257/704
(58) Field of Classification Search .................. 257/678, 257/684, 692, 704; 438/106, 121, 125
See application file for complete search history.

(56) References Cited

U.S. PATENT DOCUMENTS

| 5,701,033 | A | 12/1997 | Ueda et al. |
| 5,796,165 | A | 8/1998 | Yoshikawa et al. |
| 6,100,108 | A | 8/2000 | Mizuno et al. |
| 6,140,144 | A * | 10/2000 | Najafi et al. .................... 438/53 |
| 6,384,473 | B1 | 5/2002 | Peterson et al. |
| 6,674,159 | B1 * | 1/2004 | Peterson et al. .............. 257/680 |
| 2003/0104651 | A1 | 6/2003 | Kim et al. |
| 2004/0017004 | A1 | 1/2004 | Kasai et al. |
| 2004/0061207 | A1 | 4/2004 | Ding |
| 2004/0077117 | A1 | 4/2004 | Ding et al. |
| 2004/0173913 | A1 | 9/2004 | Ohta |

FOREIGN PATENT DOCUMENTS

| EP | 0 981 159 A1 | 2/2000 |
| EP | 1 187 322 A2 | 3/2002 |
| JP | 05-121985 A | 5/1993 |
| JP | 2002-171150 A | 6/2002 |
| WO | 01/29529 A2 | 4/2001 |

OTHER PUBLICATIONS

Zhang Shuang, "Chinese Office Action for Application No. 200780023896.3", Jan. 29, 2010, Publisher: Chinese Patent Office, Published in: CN.
Yolaine Cussac, "PCT Application No. PCT/EP2007/004847 International Preliminary Report on Patentability", Feb. 12, 2009, Publisher: PCT, Published in: EP.
German Office Action, German Patent Office, International application No. 10 2006 062 788.1-33, dated Nov. 10, 2008.

* cited by examiner

*Primary Examiner* — Long Tran
(74) *Attorney, Agent, or Firm* — Edward P. Heller, III

(57) ABSTRACT

The present invention relates to the field of electronic devices and their associated driver and/or controller integrated circuits and in particular to the mechanical packaging of electronic devices and to the packaging of electronic devices and their associated driver and/or controller integrated circuits.

8 Claims, 14 Drawing Sheets

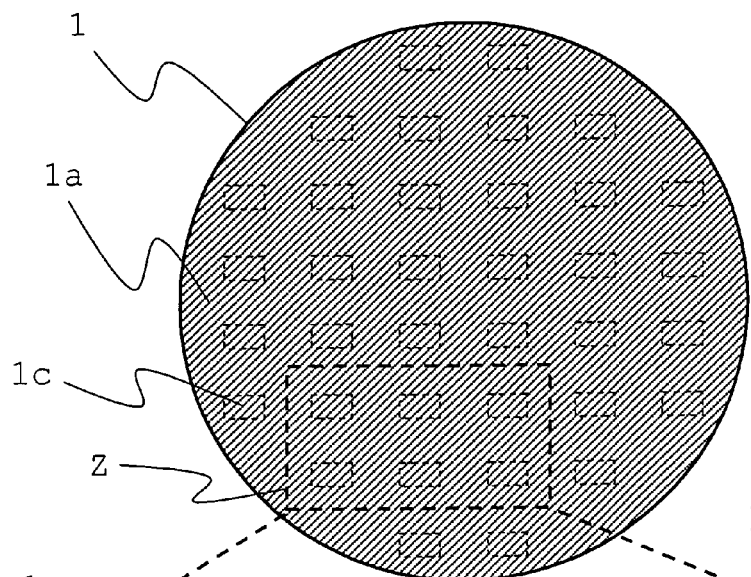
Fig. 3.a
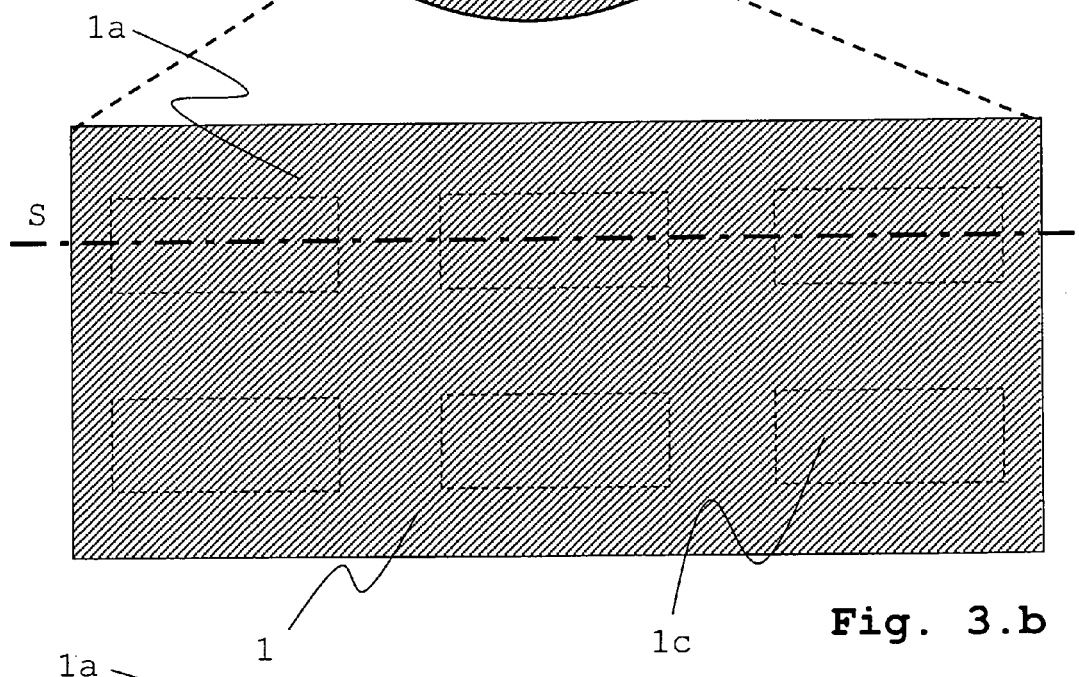
Fig. 3.b
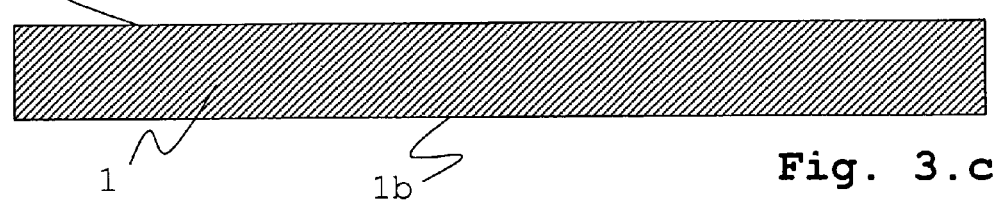
Fig. 3.c

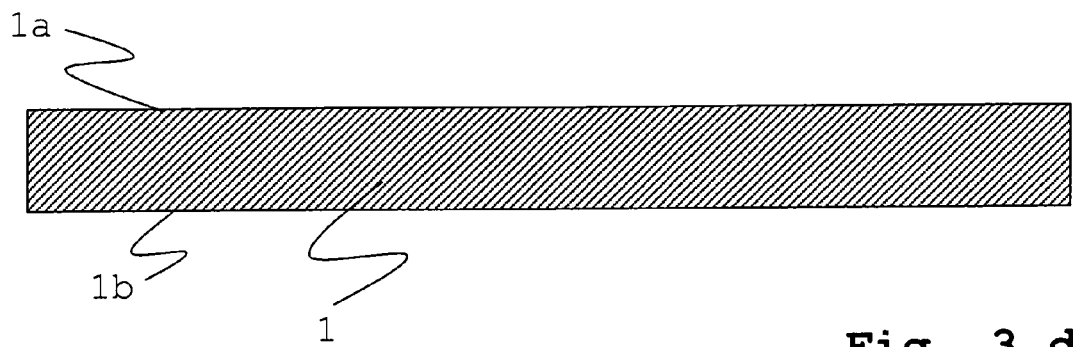
Fig. 3.d
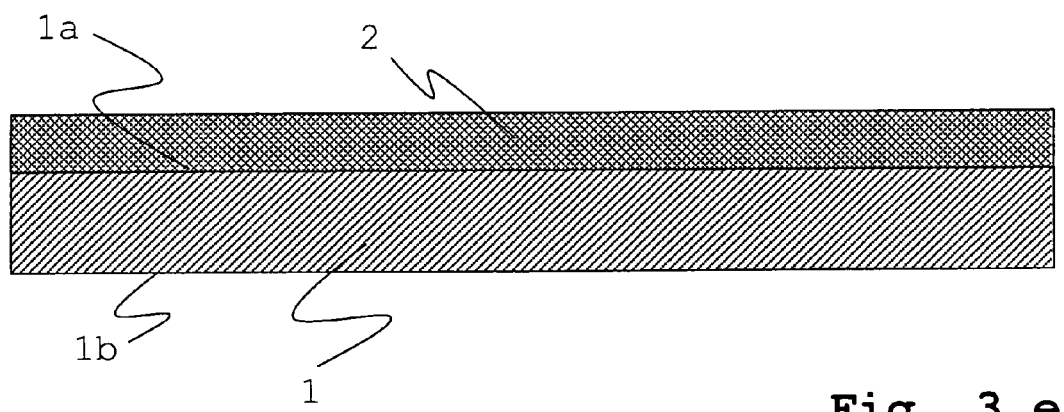
Fig. 3.e
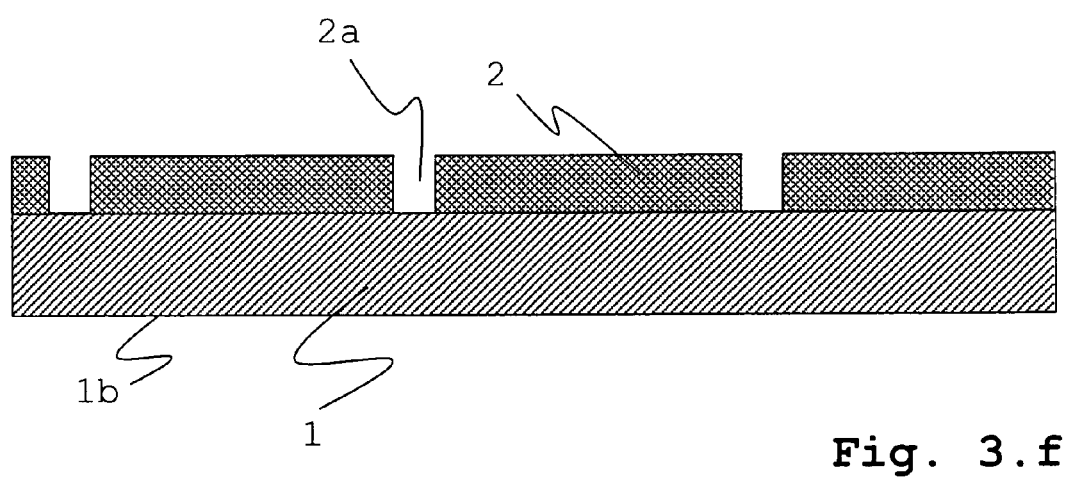
Fig. 3.f

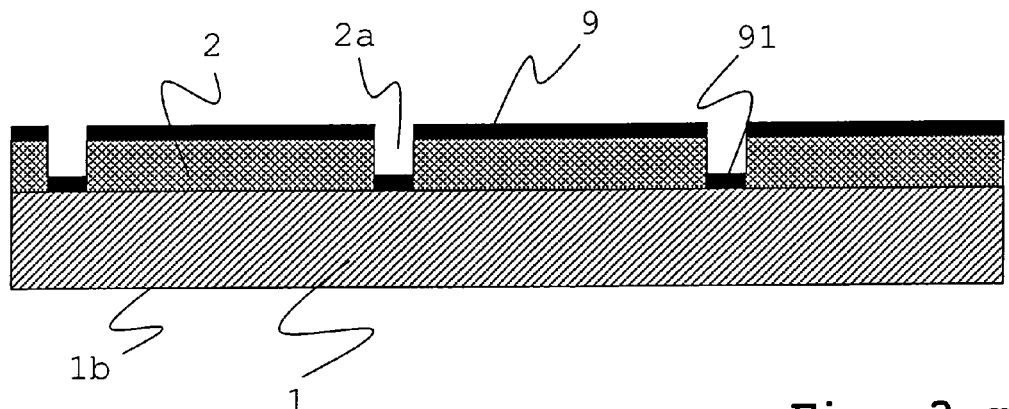
Fig. 3.g
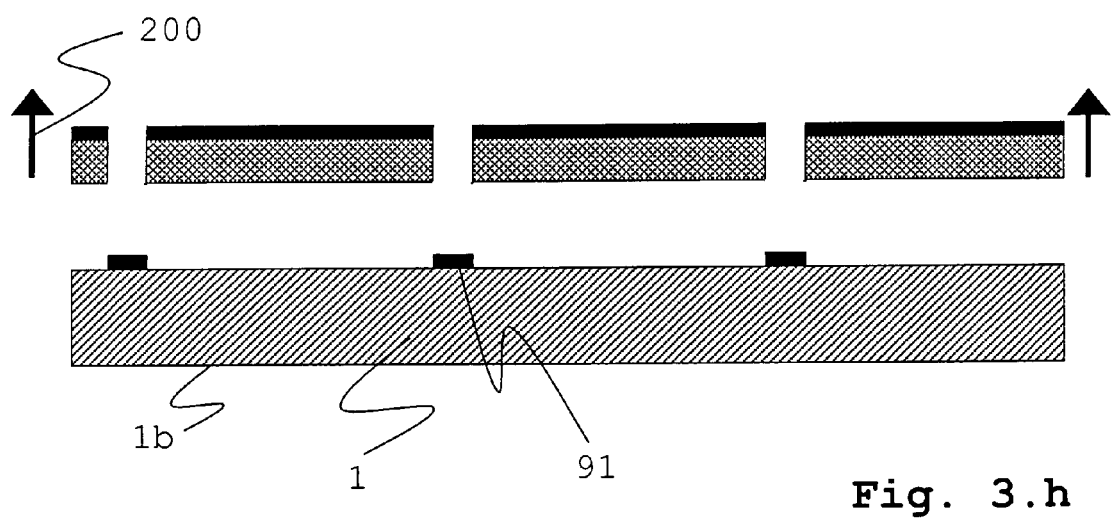
Fig. 3.h
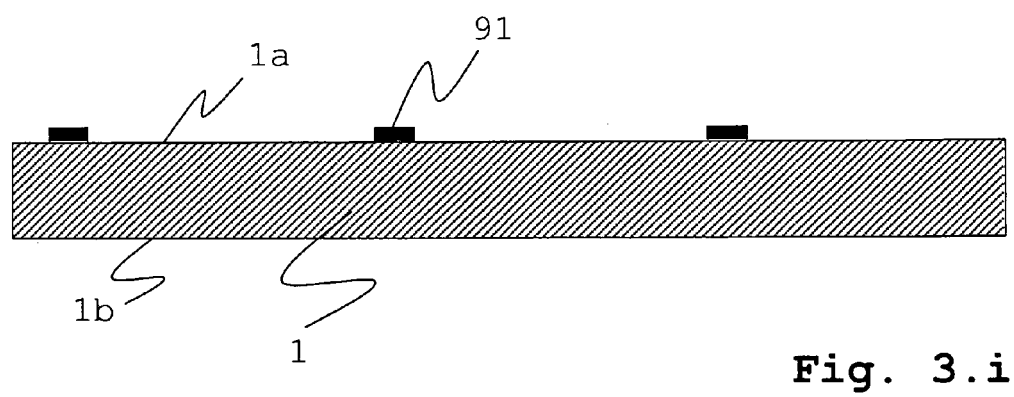
Fig. 3.i

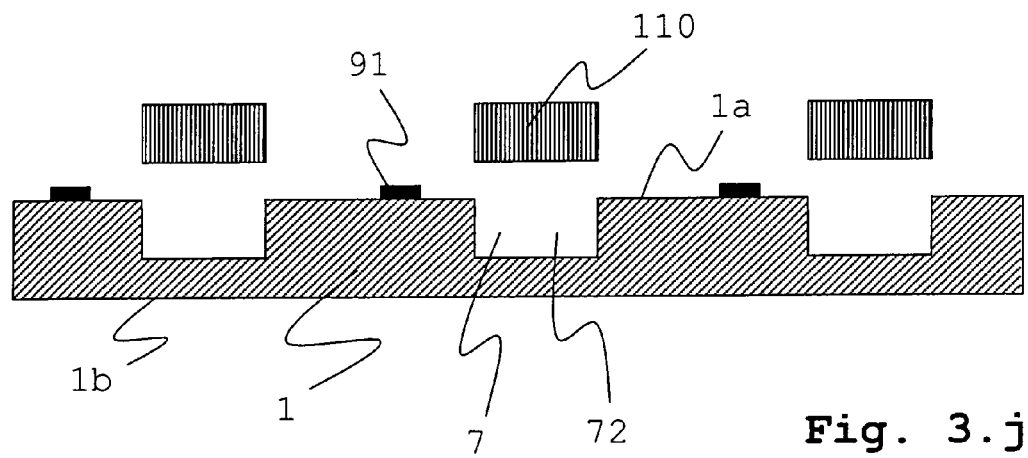
Fig. 3.j
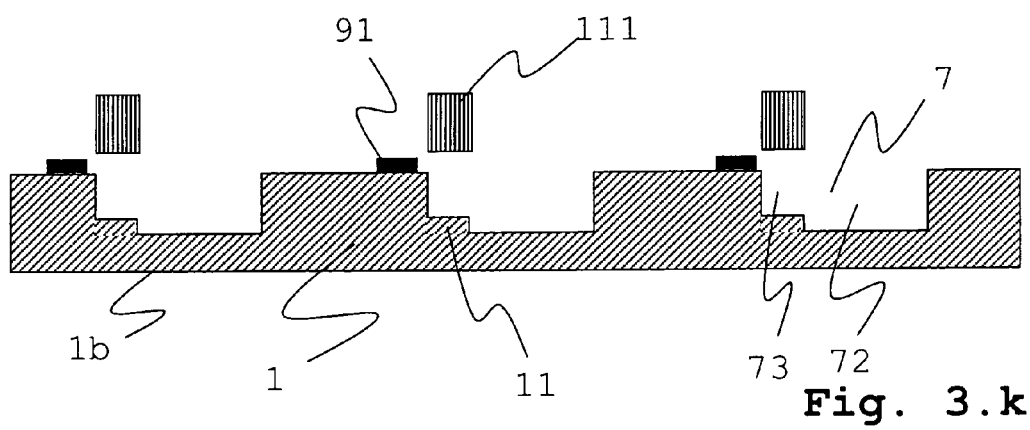
Fig. 3.k
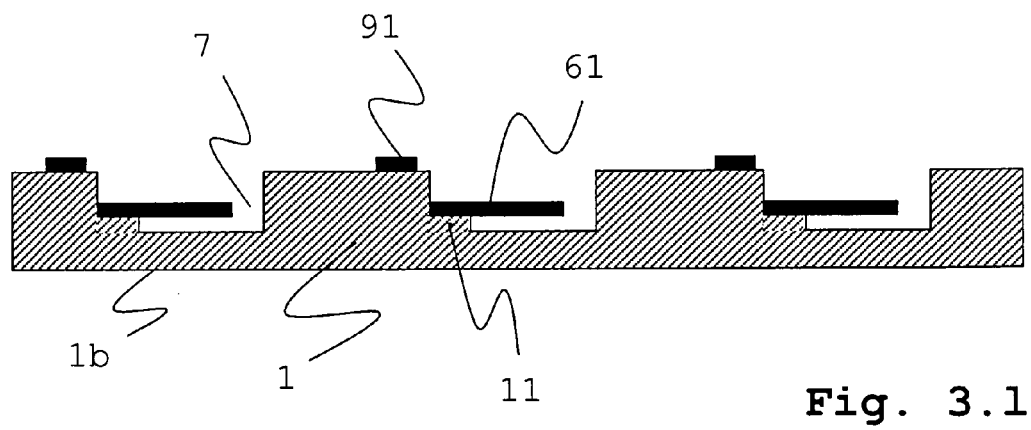
Fig. 3.l

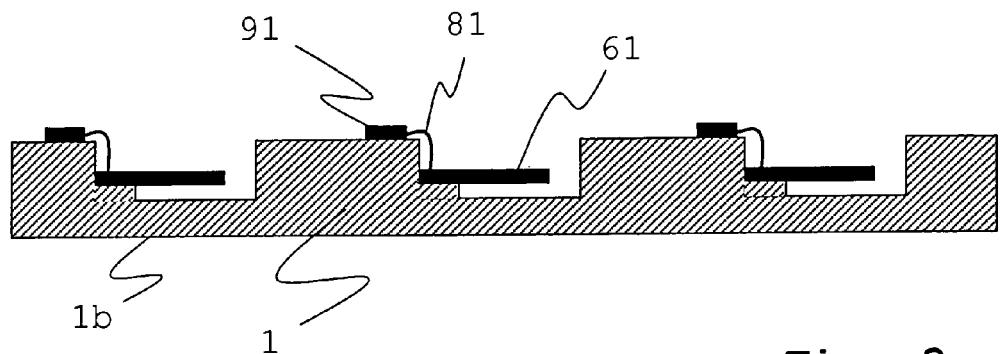
Fig. 3.m
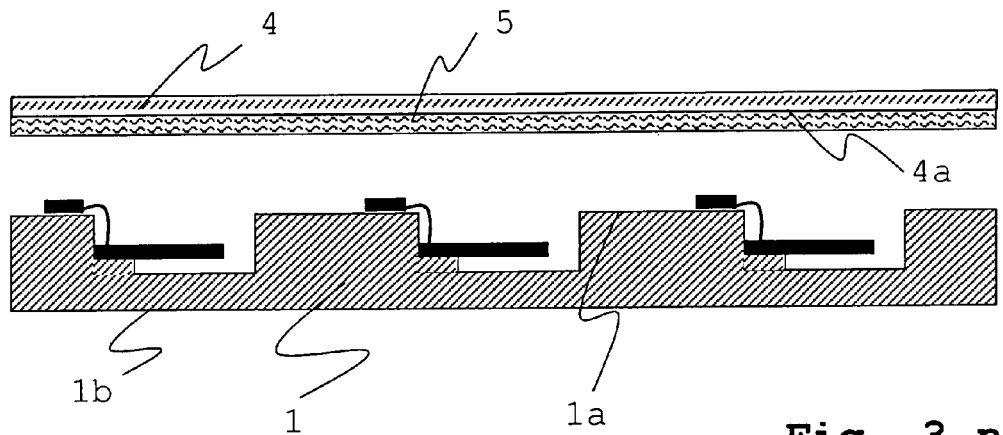
Fig. 3.n
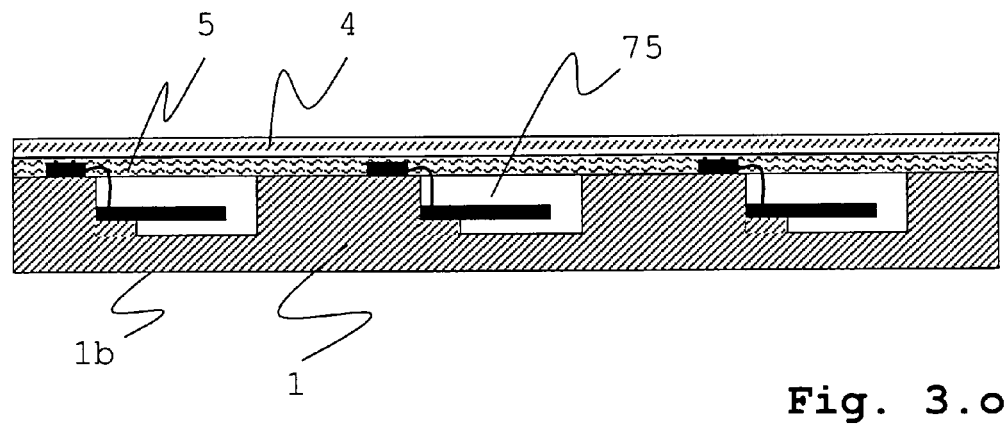
Fig. 3.o

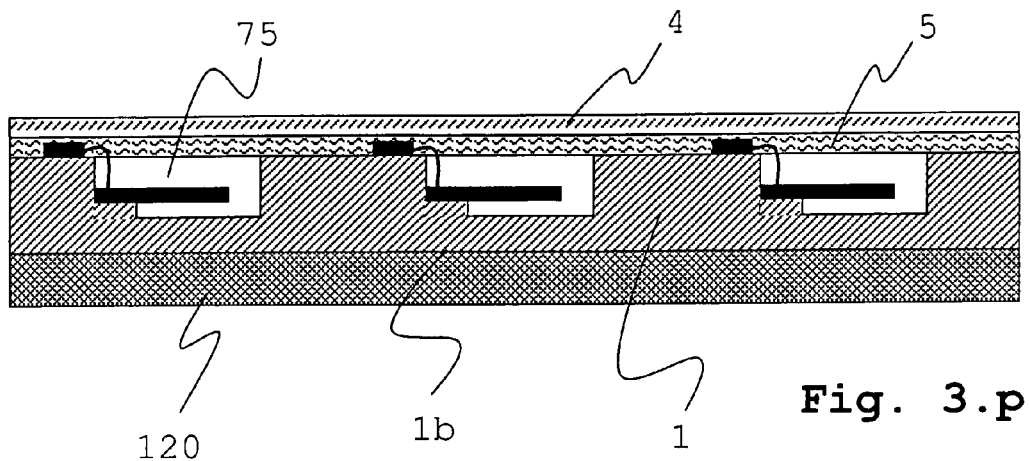
Fig. 3.p
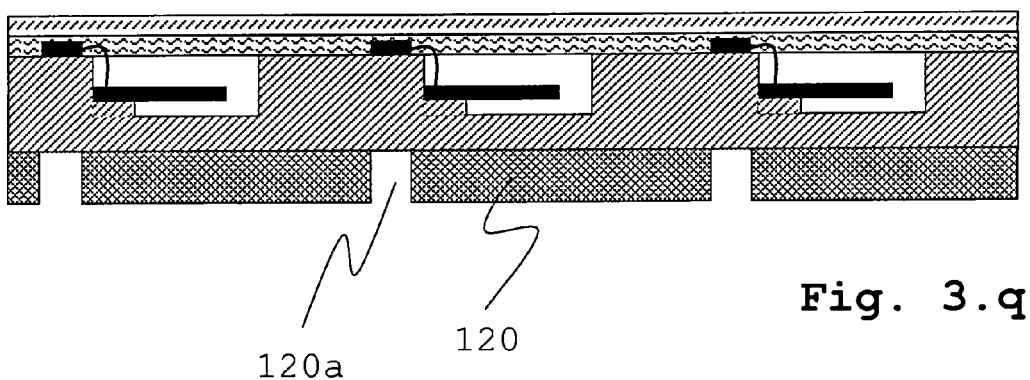
Fig. 3.q
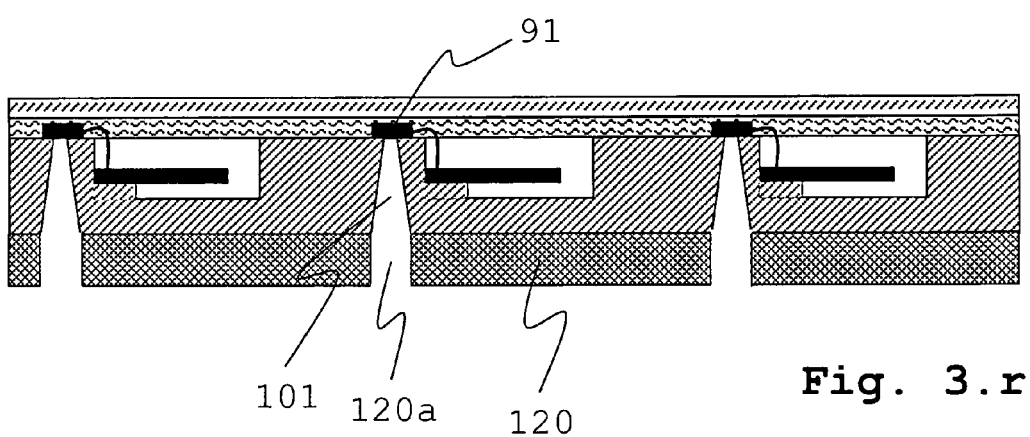
Fig. 3.r

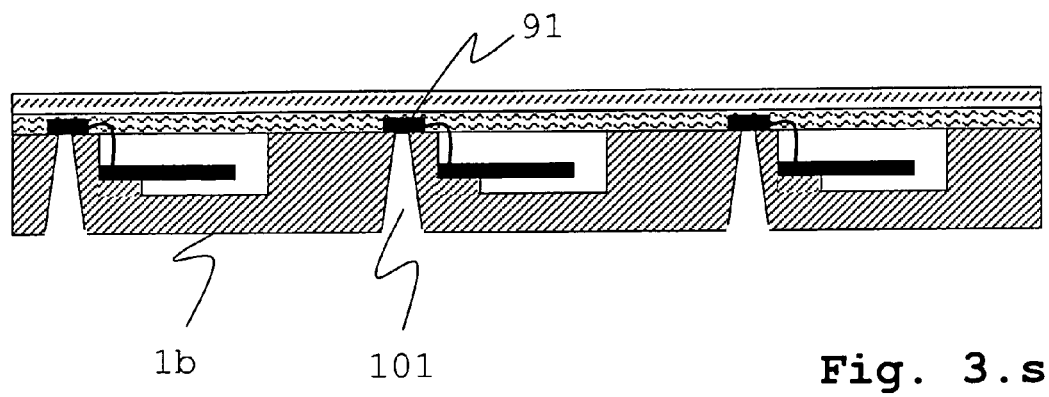
Fig. 3.s
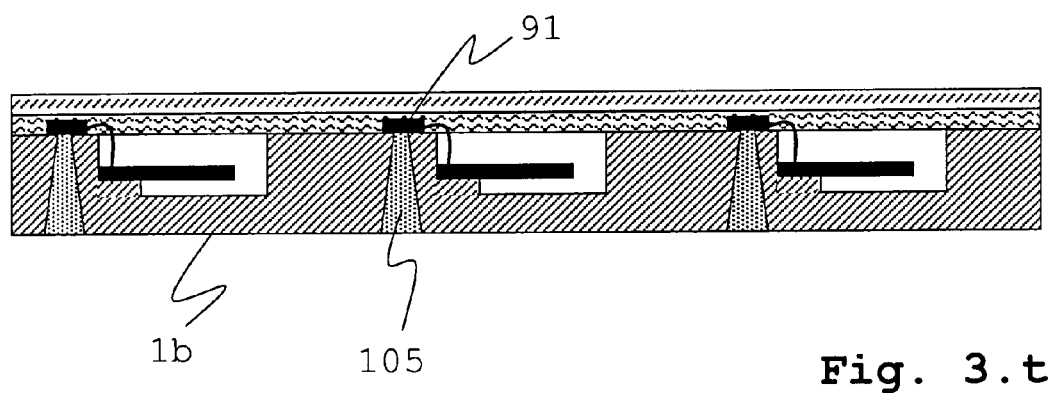
Fig. 3.t
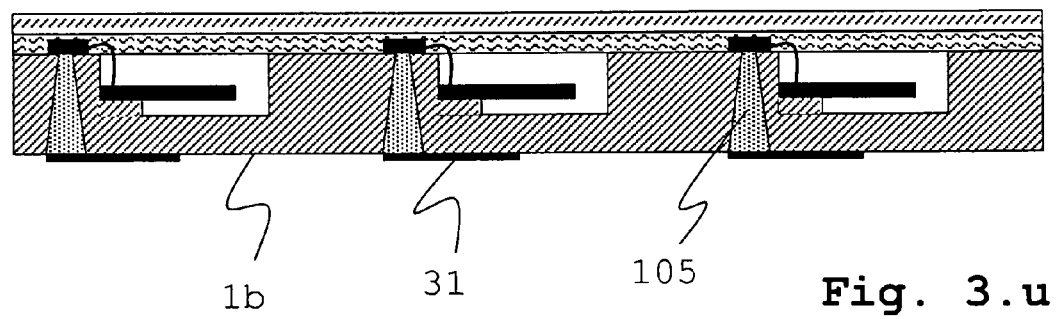
Fig. 3.u

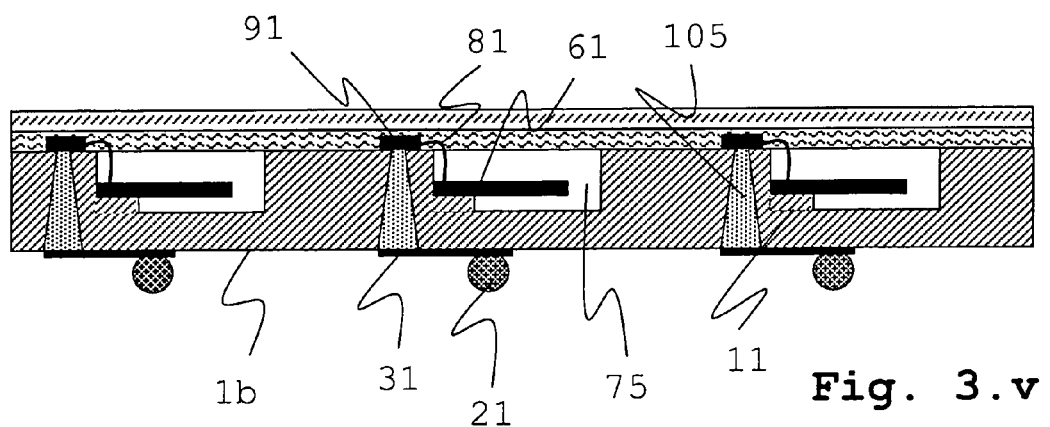
Fig. 3.v
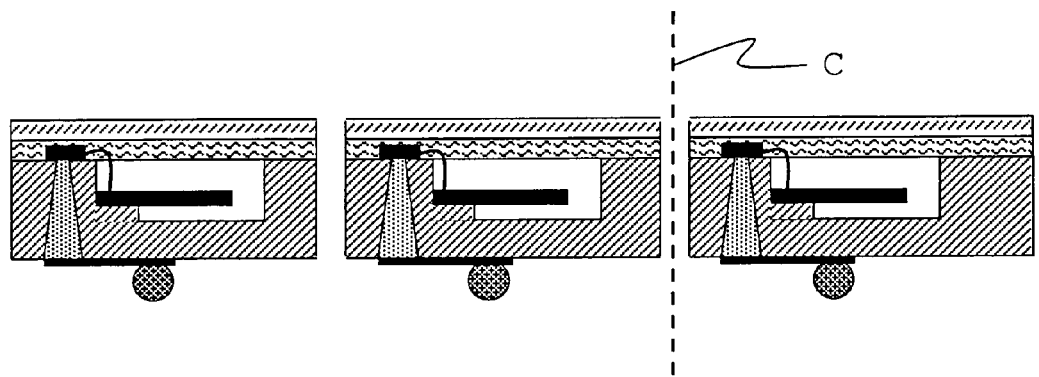
Fig. 3.w
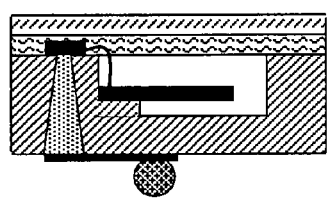
Fig. 4

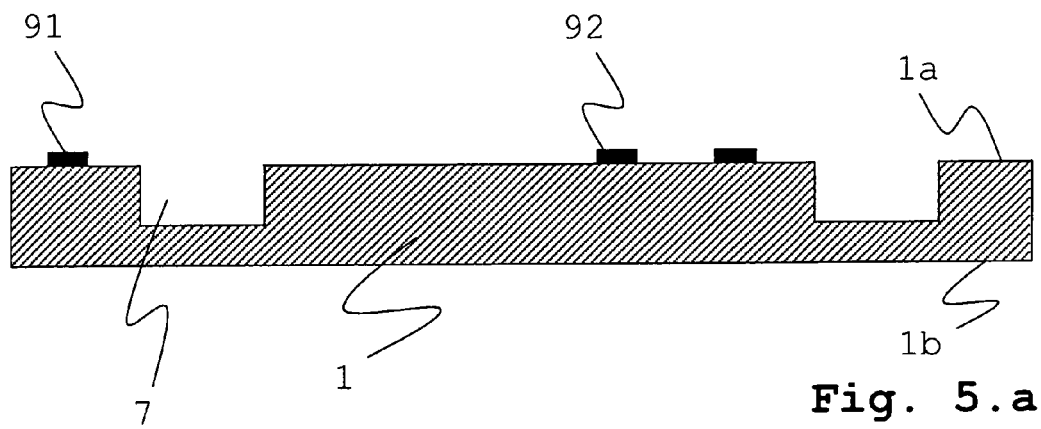
Fig. 5.a
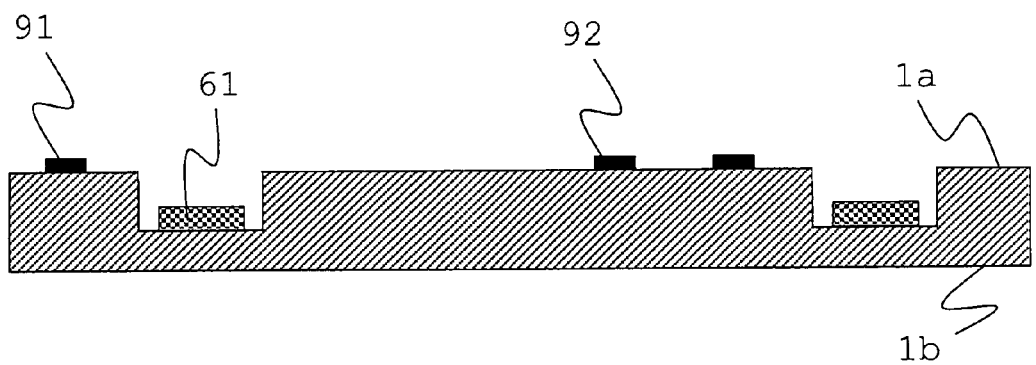
Fig. 5.b
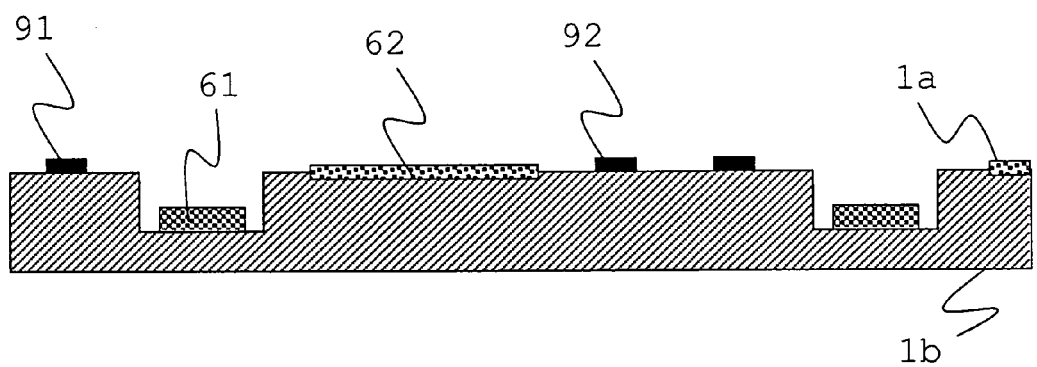
Fig. 5.c

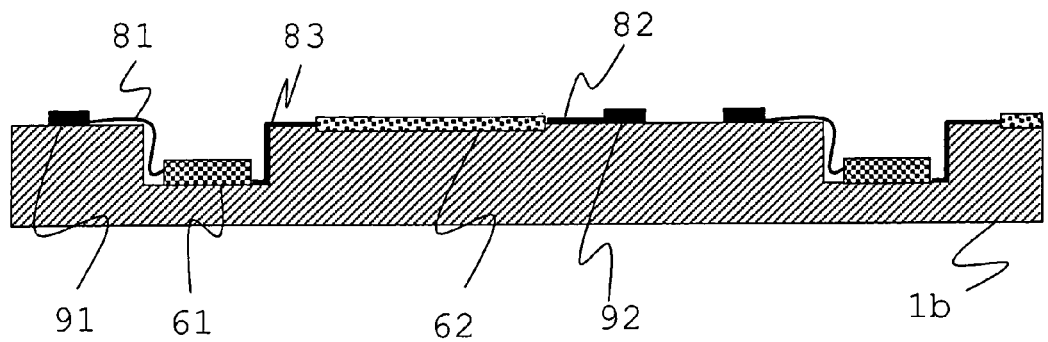
Fig. 5.d
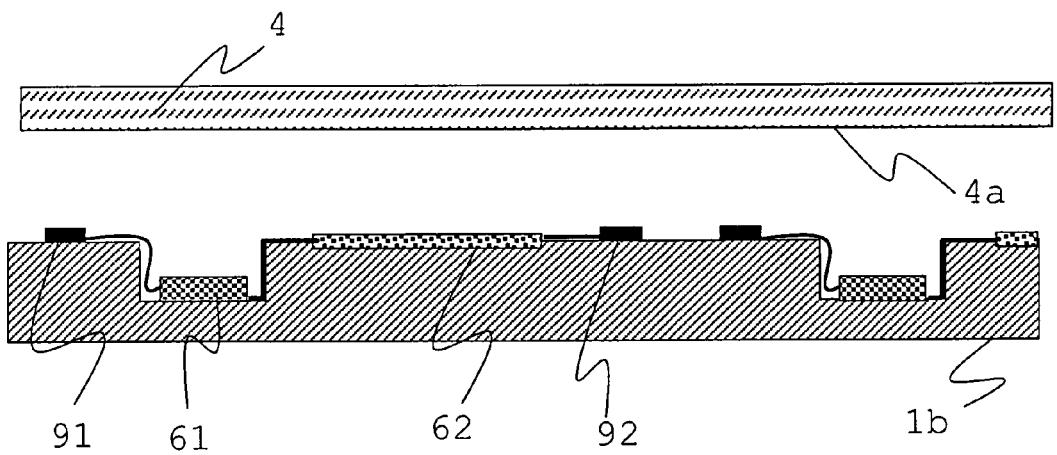
Fig. 5.e
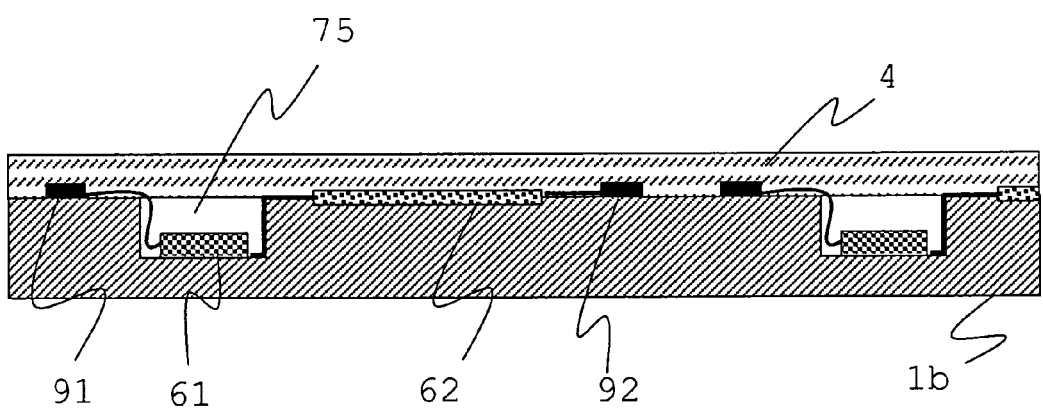
Fig. 5.f

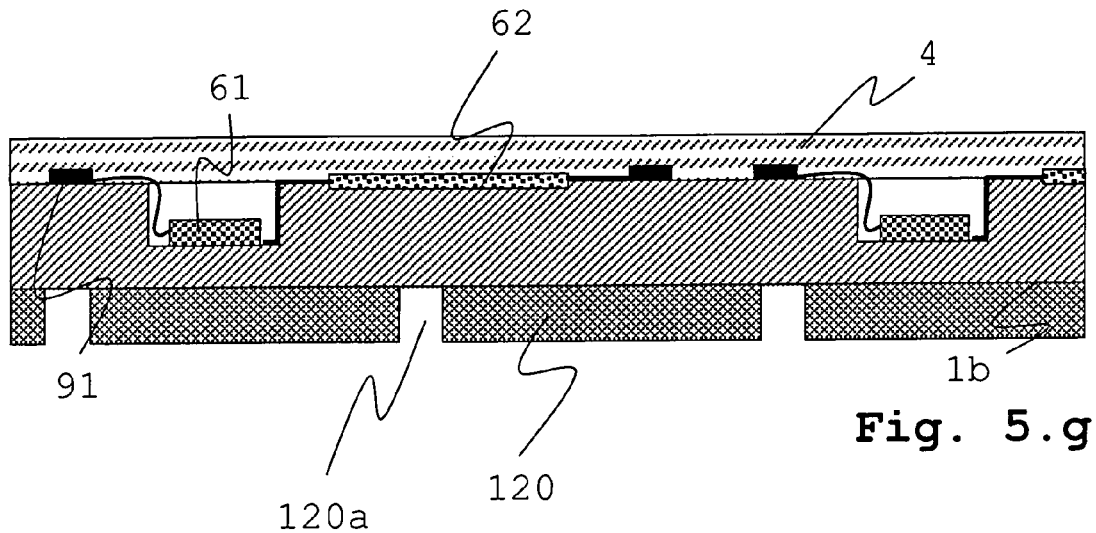
Fig. 5.g
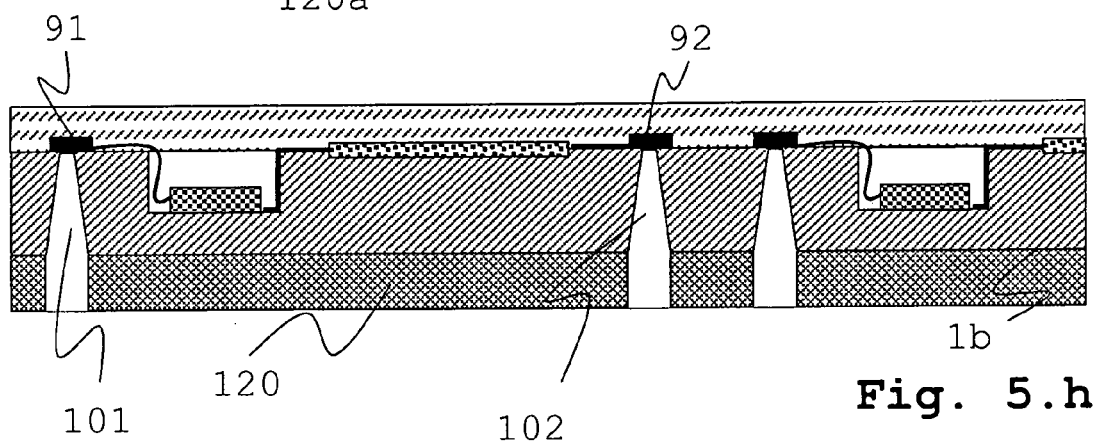
Fig. 5.h
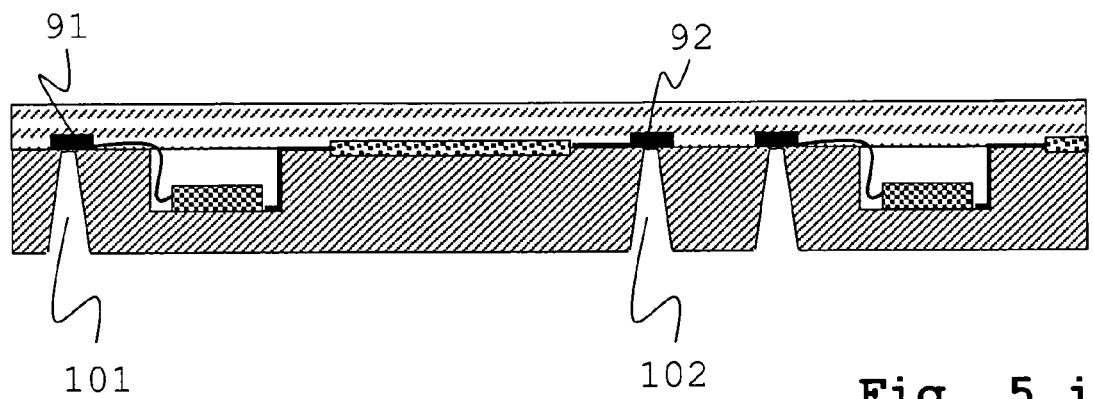
Fig. 5.i

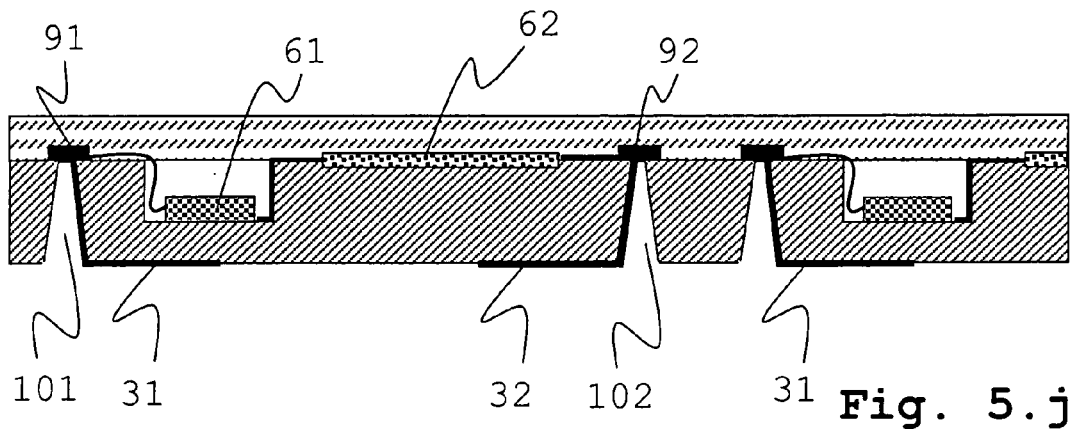
Fig. 5.j
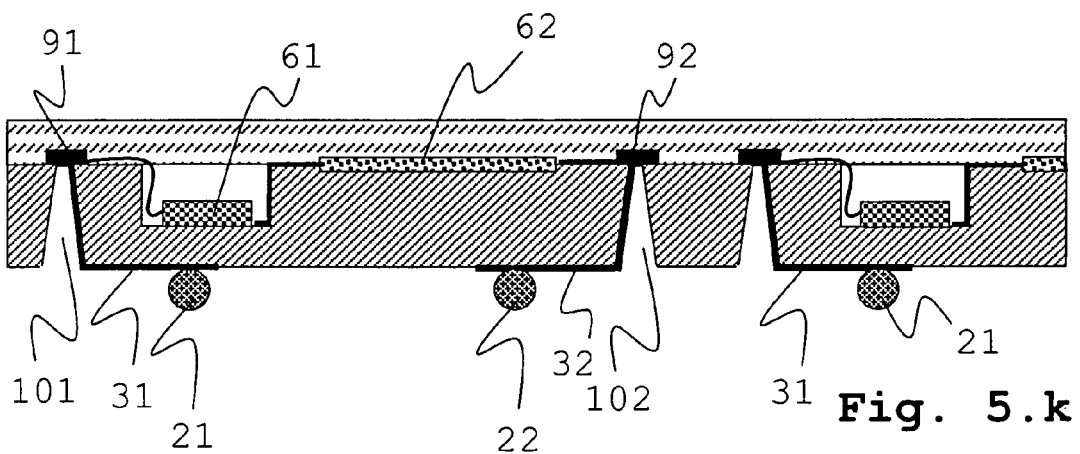
Fig. 5.k
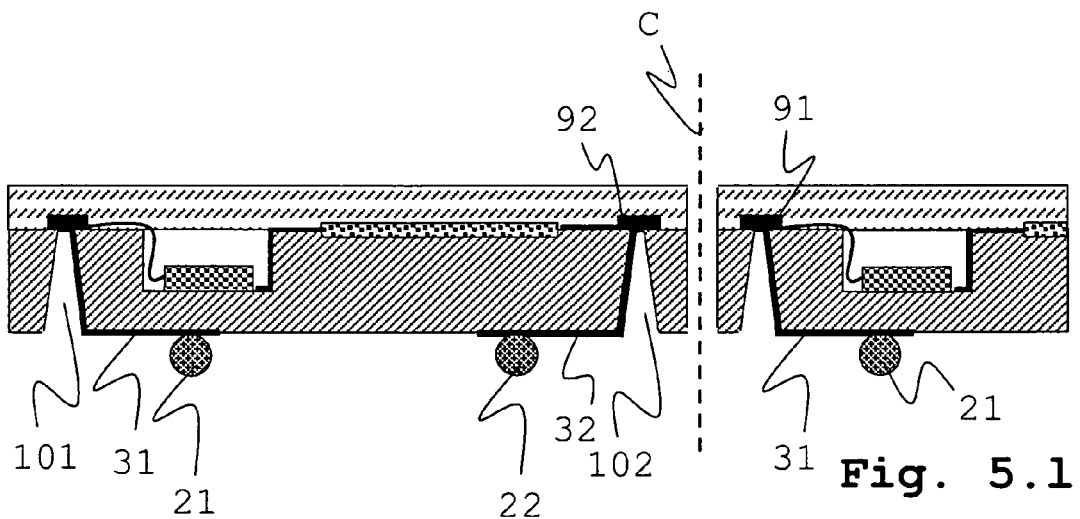
Fig. 5.l

METHOD FOR PACKAGING ELECTRONIC DEVICES AND INTEGRATED CIRCUITS

FIELD OF THE INVENTION

The present invention is related to the field of electronic devices and their associated driver and/or controller integrated circuits, and more particularly to the mechanical packaging of electronic devices and to the packaging of electronic devices and their associated driver and/or controller integrated circuits.

BACKGROUND OF THE INVENTION

Electronic devices respectively electronic components such as micro-electromechanical system (MEMS) devices are of increasing importance. Many type of systems use sensors to detect the value of a property of a physical system and to generate a corresponding electrical signal representing the sensed value.

Accelerometer sensors for example comprise a mechanically active component, e.g. an acceleration dependant oscillating mass and rely on electromechanical sensors, which translate particular types of acceleration, such as rotational or linear acceleration, into corresponding electrical signals.

Since such electronic devices are quite sensitive, they need to be protected by assembling them in some kind of package. For the manufacturing of electronic or other devices for micro systems many technologies have been developed, which enable precise forming of structured encapsulation or passivation layers and/or cavities.

Typical packaging or housing concepts, as for example moulding in plastics, are disadvantageous because the mechanical properties of said sensitive components are disturbed or even damaged. In case of SAW-filter-devices for instance even the material on the surface influences the characteristics of said filter devices.

To avoid such disturbance and to protect such sensitive electronic device, wafers with corresponding sensitive electronic devices are bonded with a second wafer or a lid wafer. Said second wafer comprises holes or trenches in the area or at the position of said electronic devices. These holes or trenches of said second wafer are fabricated in such a way that they form a cavity above the sensitive structures after bonding said second wafer to said first wafer.

DE 101 47 648 A1 for example discloses this concept for the fabrication of pocket-shaped structures for a glass lid used for packaging MEMS devices.

Alternatively also expensive ceramic packages are used to protect sensitive components.

DE 102 06 919 A1 discloses a method for packaging electronic devices using a process with the following steps: Putting said electronic devices on a first wafer, fabricating a frame structure around each electronic device and covering said frame structure with a lid structure placed on a victim layer. The frame structure around each electronic device and the covering form a cavity housing and protecting the electronic device. As already mentioned above, many types of systems use electronic devices such as sensors to detect the value of a property of a physical system and to generate a corresponding electrical signal representing the sensed value. These electrical signals are commonly provided to electrical integrated circuits, located off-chip or in adjacent locations on-chip, in order to enable a desired function, e.g. amplification, discrimination and/or signal conversion, to be performed.

In the case of a separate packaging of electronic device and associated driver and/or controller integrated circuit, the packaged electronic device is mounted on a printed circuit board along with the driver and/or controller integrated circuit, which is packaged in a similar manner. Collectively they perform the desired function, e.g. a sensing function.

Since the packaging of the electronic device and the packaging of the integrated circuit are generally significantly larger than the corresponding electronic device respectively the integrated circuit, the packaging contributes notably to the dimensions and also to the costs of the assembly on the printed circuit board.

Further, the mounting of the electronic device in the packaging limits, how close the electronic device can be placed with respect to the integrated circuit performing the controller and/or driver function. This can in turn unnecessarily limit the electrical performance of the electronic system or increase the susceptibility to noise.

WO 01/29529 A2 discloses a packaging of micro-mechanical sensors and associated control circuits. The micromechanical sensor is fabricated on a semiconductor wafer and the control circuit on a another semiconductor. A cavity is etched on the back side of the control circuit wafer, the cavity being formed such that the sensor on the other wafer fits within the cavity when the wafers are brought together in an adjoining relation.

Document U.S. 2004/0173913 A1 describes a capacitive semiconductor, a sensor chip and a circuit chip being contained in a package. Said sensor chip in mounted onto said circuit chip to provide a stack structure. Said stack structure is contained in said package. Said package is made of single ceramic substrates which are inner-hollowed. Said circuit chip is positioned onto the top side of a plate.

U.S. Pat. No. 5,701,033 relates to a semiconductor device comprising a substrate having a hollow cavity for mounting a semiconductor element therein and a lowered step surface at a periphery of the cavity for mounting a chip component thereon. Said semiconductor element is mounted within the cavity and said chip component embodied as a chip capacitor is mounted to the lowered step surface.

Document JP 2002171150 describes the structure of a package for piezoelectric vibrating devices having one side which is positioned on the top side of a carrier by means of a type of "pedestal".

U.S. 2004/0077117 A1 relates to a feedthrough design and a method for a hermetically sealed microdevice. Among other things a glass wafer and a silicon wafer are assembled to an assembly wafer which is diced into single microdevices.

Therefore, it is the object of the present invention to provide an easy, size and cost reduced but safe concept to package or house electronic devices or electronic devices together with their associated driver and/or controller integrated circuits, in particular by using conventional integrated circuit fabrication techniques and conventional packaging technologies.

GENERAL DESCRIPTION OF THE INVENTION

The inventive solution of the object of the present invention is surprisingly achieved by each of the subject matter of the respective attached independent claims. Advantageous and/or preferred embodiments or refinements are the subject matter of the respective attached dependent claims.

Accordingly, the invention proposes a method for packaging electronic components comprising the steps of providing at least one support substrate; producing at least one recess in a top side of said support substrate comprising at least one stair, placing at least one first electronic device at least partially onto said stair, in particular to support said first electronic device and/or to space said first electronic device from a bottom of said recess and covering at least partially said top side of said support substrate with a lid.

The step of covering said top side of said support substrate with a lid results in the formation of a cavity being constituted by said recess and said lid. Accordingly, said first electronic device is housed in or within said cavity. In one embodiment beside the first electronic device at least one second electronic device is placed on said top side of said support substrate. Preferably said second electronic device is placed adjacently to said recess.

The invention further proposes a method for packaging electronic components comprising the steps of providing at least one support substrate, producing at least one recess in a top side of said support substrate, placing at least one first electronic device into said recess, arranging, in particular adjacently to said recess, at least one second electronic device on or onto said top side top side of said support substrate and covering at least partially said top side of said support substrate with a lid.

Hereby, the step of covering said top side of said support substrate with a lid or a cover also results in the formation of a cavity built up by said recess and said lid. Accordingly, said first electronic device is housed in or within said recess and said second electronic device is encapsulated simultaneously. The housing of said first electronic device and the encapsulation of said second device are performed in only one step. In one alternative of this embodiment said recess is also manufactured with at least one stair to support said first electronic device and to space said first electronic device from a bottom of said recess.

The present invention also proposes an electronic package comprising at least one support substrate having at least one recess in a top side wherein said recess comprises at least one stair, at least one first electronic device arranged at least partially onto said stair spacing said first electronic device from the bottom of said recess and a lid covering at least partially said top side of said support substrate. Above proposed electronic package is in particular producible or produced with a method according to the present invention.

Said electronic package comprises a cavity which houses said first electronic device and which is formed by covering said recess with said lid. In one embodiment the electronic package further comprises at least one second electronic device being arranged, in particular adjacently to said recess, on said top side of said support substrate.

The invention further proposes an electronic package comprising at least one support substrate having at least one recess in a top side, at least one first electronic device arranged within said recess, at least one second electronic device arranged, in particular adjacently to said recess, on said top side of said support substrate and a lid covering at least partially said top side of said support substrate. Above proposed electronic package is in particular producible or produced with a method according to the present invention.

Accordingly, said electronic package comprises both a cavity which houses said first electronic device and an encapsulation of said second electronic device, both formed by covering said support substrate with said lid. In a preferred embodiment said recess comprises at least one stair onto which said first electronic device is at least partially arranged and which spaces said first electronic device from the bottom of said recess.

Several embodiments of the electronic package are explicitly mentioned. However, since said electronic package is particularly producible or produced by the inventive method, the features of the above and below described method according to the invention correspond also to means or components of the electronic package being produced by said method features.

Said first electronic device comprises MEMS devices such as SAW filter devices, quartz device, thermo sensors, pressure sensors and/or or gyroscopes. In further embodiments said first electronic device comprises sensorial function elements, semiconductor function elements, thermo function elements, mechanical function elements and/or optical function elements. The first electronic device according to the invention has a thickness or a height in the order of 1 $\mu$m up to 1000 $\mu$m, preferably in the order of some tens $\mu$m or 50 $\mu$m up to some hundreds $\mu$m or 200 $\mu$m and a diameter in the order of 1 $\mu$m up to some tens mm, preferably in the order 10 $\mu$m up to 10 mm.

Said support substrate can be provided as a semiconductor substrate. In one embodiment a Silicon semiconductor is provided as said semiconductor substrate. In another embodiment a compound semiconductor comprising the materials GaAs, InP and/or SiGe is provided as said semiconductor substrate.

Another embodiment uses a semiconductor being characterized by a wide energy gap as said semiconductor. The energy gap is in the order of 2.5 eV up to 10.0 eV, preferably in the order of 3.0 eV up to 6.0 eV. In this case a sapphire is a preferred semiconductor substrate.

The fabrication of said recess on said top side of said support substrate is performed by a subtractive process such as etching, lapping and/or sand blasting. The dimensions of said recess are adapted to the dimensions of the first electronic device to accommodate. The dimensions of the recess need to be chosen such that said first electronic device dives, in particular in essential, completely into said recess. Accordingly, said recess has a depth in the order of 1 $\mu$m up to 1000 $\mu$m, preferably in the order of 50 $\mu$m up to 200 $\mu$m and a diameter in the order of 1 $\mu$l m up to some tens mm, preferably in the order 10 $\mu$m up to 10 mm.

Some embodiments comprise, as already described above, the feature of a recess provided with at least one stair to support and to space said first electronic device from a bottom of said recess. The dimensions of said stair are dependent on the size of the recess. Accordingly, the stair height is smaller than the recess depth and the stair length is smaller than the recess diameter. Said stair has a height in the order of 1 $\mu$m up to 400 $\mu$m, preferably in the order of 50 $\mu$m up to 200 $\mu$m and a length in the order of 1 $\mu$m up to some tens mm, preferably in the order of 10 $\mu$m up to 10 mm. The total stair height or the average stair height corresponds to about 1% to 80%, preferably 10% to 60% of the total recess height or the average recess height. In a particular preferred embodiment said stair height corresponds to about 20% to 50% of the total recess height or the average recess height. The stair length corresponds to about 1% to 80%, preferably 3% to 40% of the total recess length or the average recess length. In a particular preferred embodiment said stair length corresponds to about 5% to 30% of the total recess length or the average recess length.

Said first electronic device is mounted on said stair by gluing, soldering, low temperature glass molding and/or pasting, in particular Ag pasting. Hereby, said first electronic device can be movable mounted. In a particular embodiment this kind of mounting enables the first electronic device to oscillate. The fabrication of said recess is performed by varying the parameters of the above mentioned subtractive process to fabricate the recess.

If the recess according to the invention comprises a stair, said stair can be produced in an one-step-process or in a multi-step-process. For instance, a one-step-process can be realized by a lapping tool or a kind of lapping stamp having the shape corresponding at least essentially to the negative shape of the recess and stair. An example for a multi-step-process corresponds to the application of lapping tools of different sizes and/or shapes. The application combination of said different lapping tools enables the formation of recesses and the corresponding stair. Another example for a multi-step-process corresponds to an etching process using photo-lithographic structuring.

In one embodiment said second electronic device is provided as an integrated circuit. Said integrated circuit can be provided or produced as a solid state or monolithic integrated circuit, as a film integrated circuit and/or as a hybrid integrated circuit. In another embodiment said integrated circuit is provided as a driver or controller integrated circuit for said first electronic device. In a further embodiment said integrated circuit comprises both function, i.e. being both driver and controller integrated circuit for said first electronic device.

To avoid or reduce electronic noise, for instance during a transmission of an electrical signal from said first electronic device to said second electronic device or vice versa, said second electronic device is placed as close as possible to said first electronic device. For instance, said second electronic device directly verges on the upper edge of said recess. Preferably said first electronic device and second electronic device are electrically connected. This connection is performed by wire bonding, soldering and/or metal pasting comprising the materials Au, Al, PbSn, SnAgCu and/or Ag.

The mounting or producing method as well as the dimensions of the second electronic device or integrated circuit are dependent on its embodiment. Said second electronic device is mounted on said top side by gluing, brazing, soldering, low temperature glass molding and/or pasting, in particular Ag pasting, respectively is produced by evaporation, CVD, sputtering, epitaxial growth and/or dotation.

At least one first electrical contact pad is deposited on said top side of said support substrate, in particular adjacent to said recess containing said first electron device. Said first electrical contact pad is fabricated by photo-lithographic techniques using for instance PVD, in particular evaporation and/or sputtering, and/or CVD. The materials forming said first electrical contact pad comprise Au, Al, TiCu, AlSiCu, AlSiTi, W, Cu and/or AlCu. Said first contact pad comprises a thickness in the order of 1 nm up to some tens μm, preferably in the order of 100 nm up to 1 μm and a diameter in the order of 1 μm up to some hundreds μm, preferably in the order of 10 μm up to 500 μm. Said first electrical contact pad is in particular electrically connected with said first electronic device. This connection is performed by wire bonding, soldering and/or metal pasting comprising the materials Au, Al, PbSn, SnAgCu and/or Ag.

According to the corresponding embodiments at least one second electrical contact pad is arranged on said top side of said support substrate, in particular adjacently, to said second electron device to contact said second electronic device. Said second electrical contact pad can be fabricated by using the same techniques and materials as mentioned above for said first electrical contact pad. Preferably the first and the second electrical contact pad are fabricated simultaneously in one step. Said second electrical contact pad is electrically connected with said second electronic device. This connection can be performed according to the above described connection between said first electronic device and said first electrical contact pad.

Said support substrate is covered by said lid or cover in an adjoining relationship. This covering leads to the formation of a cavity by said recess housing the first electronic device. According another embodiment of the present invention having both said first electronic device in said recess and second electronic device on said top side of said support substrate, the covering of the support substrate by said lid forms both a cavity housing the first electronic device and an encapsulation for said second electronic device simultaneously. The inventive method eliminates the need for a separate packaging of electronic devices and their corresponding integrated circuits. The disclosed packaging method advantageously eliminates the handling of exposed sensors during packaging operations, and results in a closer placement of the electronic device and its associated integrated circuit, so that cost are reduced and greater systems performance can be achieved using common packaging technologies.

Preferable materials for said lid comprise glass, metal, ceramic, semiconductor and/or plastic and can be provided as a film. Dependent on its material said lid comprises a thickness in the order of 10 μm up to some mm, preferably in the order of 100 μm up to 1 mm. Said lid covers at least partially said support substrate. In a further embodiment the diameter of said lid corresponds essentially to the diameter of said support substrate to cover.

A contact side of said lid touching at least partially said top side of said support substrate is provided flat, i.e. non-structured, so that said contact side of said lid is entirely in touch with said top side of said support substrate. In another embodiment said contact side of said lid, which touches said top side of said support substrate, is provided structured, i.e. comprising a first recess in the area of said first electronic device. In this particular embodiment the cavity, which houses said first electronic device is formed by said recess in said support substrate and by said recess in said lid. In another embodiment said contact side of said lid is provided structured such that said contact side comprises a first recess in the area of said first electronic device or a second recess in the area of said second electronic device. In a further embodiment said contact side of said lid is provided structured such that said contact side comprises a first recess in the area of said first electronic device and a second recess in the area of said second electronic device. Accordingly, said contact side of said lid is provided structured comprising at least one recess in said lid contact side. In this particular embodiment beside the cavity, which houses said first electronic device and which is formed by said first recess, also a cavity is formed by said second recess, which houses said second electronic device.

Said top side of said support substrate and said contact side of covering said lid are bonded together. Possible techniques for bonding said top side of said support substrate and said contact side of said lid together are anodic bonding, low-temperature-bonding, brazing, gluing, soldering and/or glass melting, in particular low temperature glass melting. According to one embodiment said contact side of said lid and/or said top side of said lid is respectively are covered at least partially with at least one adhesive layer and said support substrate and said lid are bonded together via said at least one adhesive layer. Said adhesive layer comprises a thickness in the order of 100 nm up to some tens μm, preferably in the order of 1 μm up to 10 μm and a diameter corresponding in particular essentially to the diameter of said lid or said support substrate to cover. In another embodiment both sides, i.e. said contact side of said lid and said top side of said support substrate are covered with at least one adhesive layer and said support substrate and said lid are bonded via said adhesive layers. Since it is easy to deposit, in a preferred embodiment the adhesive layer covers entirely said contact side of said lid.

In another embodiment said adhesive layer comprises at least one gap or recess. In one embodiment said adhesive layer comprises at least one first gap or one first recess in the area of said first electronic device or said recess and/or a second gap or second recess in the area of said second electronic device. Accordingly, the corresponding recess, which accommodates said first electronic device, and/or said second electronic device is respectively are not covered by said adhesive layer enabling the possibility of using electronic devices sensitive to said adhesive layer. Said adhesive layer is for instance realized by gluing, blazing, soldering and/or glass layer melting. Possible materials in accordance to above mentioned methods forming said adhesive layer are resin, preferentially epoxy resin and/or acrylic resin, AuSn, PbSn, SnAgCu and/or low temperature melting glass. Said adhesive layer is deposited by spin coating, spray coating, PVD, in particular sputtering and/or evaporation, screen printing and/or filming. In a preferred embodiment of the present invention the cavity housing the first electronic device is formed such that said first electronic device and/or said second electronic device is respectively are hermetically sealed. In particular said first electronic device and/or said second electronic device is respectively are hermetically sealed in said cavity respectively in between the contact side of the lid and the top side of the support substrate.

To provide the electrical contact to the housed first electronic device at least one first via-hole is fabricated into a bottom side of said support substrate and/or a rear side of said lid allowing access to said first electrical contact pad or connecting top said and bottom side of said support substrate. Possible techniques for the fabrication of said first via-hole are etching, lapping and/or sand blasting. If suitable, photo-lithographic techniques can be applied. The via hole or said first via-hole is fabricated as deep as allowing direct access to said first electrical contact pad. Accordingly, said first via-hole has a depth according to the thickness of said support substrate and a diameter in the order of 1 μm up to some hundreds μm, preferably in the order 50 μm up to 200 μm.

For establishing an electrical connection from said bottom side of said support substrate or from said rear side of said lid trough said first via-hole to said first electrical contact pad and said first electronic device, an electrical connection, in particular at least one first electrical connection line, is fabricated. Possible techniques for the fabrication of said first electrical connection line are PVD, for instance evaporation and/or sputtering, and/or CVD comprising the materials Au, Al, Cu, AlSi and/or AlCu. If suitable, photo-lithographic techniques can be applied.

Enabling an easy further processing of the resulting electronic package e.g. its mounting on a printed circuit board at least one first solder ball is placed onto said first electrical connection line. A preferred technique for the mounting of said first solder ball is a reflow process, laser mounting, Au/Au floating process, conductive film interconnecting process and/or Ag soldering. Accordingly, preferred processes involve a melting of prefabricated solder balls on said first electrical connection line. Said first solder ball has a diameter in the order of 10 μm up to some hundreds μm, preferably in the order 100 μm up to 500 μm comprising PbSn, SnAgCu and/or ZnSn.

According to the above mentioned particular preferred embodiment of this invention at least one second via-hole is fabricated into said bottom side of said support substrate or into said rear side of said lid, allowing access to said second electrical contact pad. Said second electrical via-hole can be fabricated by using the same technique and same materials as mentioned above for said first via-hole. Preferably said first and said second via-hole are fabricated simultaneously in one step. Said second via-hole allows access to said second electrical contact pad.

According to this embodiment also an electrical connection, in particular at least one second electrical connection line, is fabricated trough said second via-hole from said second electrical contact pad to said bottom side of said support substrate or to said rear side of said lid. And also at least one second solder ball is placed onto said second electrical connection line. Said second electrical connection line and/or said second solder ball can be fabricated by using the same technique and same materials as mentioned above for the corresponding said first electrical connection line respectively said first solder ball, preferably they are mounted simultaneously.

Electrical connections or electrical connection lines between said first contact pads and said first electronic devices, between second contact pad and second electronic device and/or between first electronic device 61 and second electronic device can be fabricated by using the same technique and same materials as for the above mentioned first electrical connection line.

The above described photo-lithographic technique for deposition processes, as for instance PVD, comprises the steps of coating the support substrate with a photosensitive resist layer, photo-lithographic structuring of the applied resist layer, coating the pre-structured substrate with the corresponding layer which comprises the corresponding material and lifting off the resist layer. The photo-lithographic structuring step comprises mask exposure and subsequent developing. The step of coating can be carried out by spin coating, spraying, electrodeposition and/or by depositing of at least one photosensitive resist foil. The step of lifting off the resist layer is carried out in such a manner that at least one layer that has been applied to the resist layer is also lifted off. The fabrication of via holes or recesses by photo-lithographic techniques is correspondingly applied.

Beside the mounting of the above mentioned components to form said electronic package, i.e. the mounting of the electronic package as a single chip, the mounting can be performed in one preferred embodiment in a wafer assembly. Accordingly, a multitude of chips of the same type are fabricated simultaneously. Said wafer assembly comprising said multitude of electronic packages is diced into single chips via sawing, lapping, sand blasting, laser cutting, diamond scribing and/or snapping. In a first embodiment each chip comprises said first electronic device, said cavity, said first electrical contact pad, said first via-hole, said first electrical connection line and said first solder ball. Said electronic package comprises a thickness in the order of 10 μm up to 5 mm, preferably in the order of 100 μm up to 1 mm and a diameter in the order of 1 μm up to 200 μm, preferably in the order of 10 μm up to 100 μm. In another embodiment each chip comprises said first electronic device, said cavity, said second electronic device, said first electrical contact pad, said second electrical contact pad, said first via-hole, said second via-hole, said first electrical connection line, said second electrical connection line, said first solder ball and said second solder ball. Said electronic package comprises a thickness in the order of 50 μm up to 2 mm, preferably in the order of 100 μm up to 1 mm and a diameter in the order of 500 μm up to 20 mm, preferably in the order of 1 mm up to 10 mm.

The method according to this invention enables an efficient fabrication of packaged electronic devices and of packaged electronic devices and their associated controller and/or driver integrated circuits.

The invention is explained subsequently in more detail on the basis of preferred embodiments and with reference to the appended figures. The features of the different embodiments are able to be combined with one another. Identical reference numerals in the figures denote identical or similar parts.

DESCRIPTION OF THE FIGURES

FIG. 3.a to 3.w schematically illustrate in a side view the process steps to fabricate an electronic package according to the invention involving a first electronic device.

FIG. 4 schematically shows an electronic package being produced according to the method illustrated in FIGS. 3.a to 3.w.

FIG. 5.a to 5.l schematically illustrate in a side view the process steps to fabricate an electronic package according to the invention involving a first electronic device.

Subsequently, preferred but exemplar embodiments of the invention are described in more detail with regard to the figures.

DETAILED DESCRIPTION OF EXEMPLARY EMBODIMENTS

The figures show the feature of a backside-contacting. The electronic components, in particular the first and the second electronic device are electrically contacted via the backside 1b of said support substrate.

Figure 1:
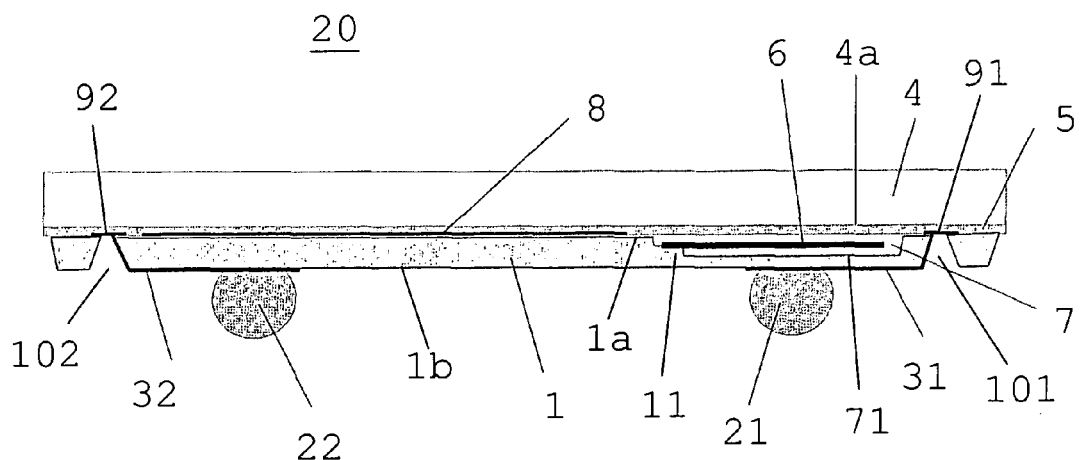
FIG. 1 shows a schematic side view of an electronic package comprising a first electronic device being movable mounted and a second electronic device.
Figure 2:
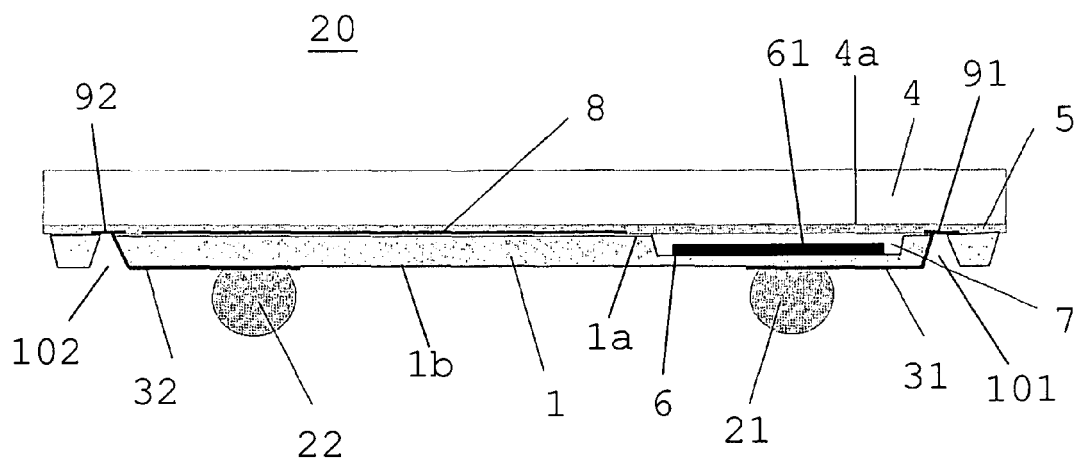
FIG. 2 shows a schematic side view of a further electronic package comprising a first electronic device and a second electronic device.

FIGS. 1 and 2 show a schematic side view of an electronic package 20 comprising a first electronic device 61 and a second electronic device 62 producible or produced with a method according to the invention. The electronic package 20 comprises a support substrate 1, which has at least one recess 7 in its top side 1a. Said support substrate 1 is bonded with a lid 4, which forms simultaneously a cavity 75 housing a first electronic device 61 and an encapsulation of a second electronic device 62 placed adjacent to said recess 7 on said top side 1a. Said first electronic device 61 is connected to a first electrical contact pad 91. Said first electrical contact pad 91 is connected trough a first via-hole 101 and a therein placed first electrical connection line 31 to a bottom side 1b of said support substrate 1 and is connectable by a first solder ball 21, e.g. to a printed circuit board. Said second electronic device 62 is connected to a second electrical contact pad 92. Said second electrical contact pad 92 is connected trough a second via-hole 102 and a therein placed second electrical connection line 32 to a bottom side 1b of said support substrate 1 and is further connectable by a second solder ball 22, e.g. to a printed circuit board. In FIG. 1 said first electronic device 61 is mounted on a stair 11. In particular said first electronic device 61 is movably mounted on said stair 11. In FIG. 2, in contrast to FIG. 1, said first electronic device 61 is directly mounted or placed onto the bottom 71 of the recess 7 and said first electronic device 61 can not be enabled to oscillate.

One fabrication method embodiment is subsequently explained in more detail in FIGS. 3.a to 3.w. The illustrated method shows the packaging of electronic components on a wafer level. The method for packaging electronic components according to FIGS. 3.a to 3.d comprises the first step of providing a wafer or a support substrate 1. Said support substrate 1 is a semiconductor substrate. Said support substrate 1 comprises a thickness in the order of 50 µm up to 500 µm and a diameter in the order of 4" up to 12". FIG. 3.a shows a view onto the top side 1a of a support substrate 1. FIG. 3.b shows a zoom of the section Z shown in FIG. 3.a. It is illustrated a partitioning of the wafer in sections 1c. A fabrication or mounting of electronic components or devices, for instance of the first and/or the second electronic device 61 respectively 62, occurs within these sections 1c. FIG. 3.c and 3.d show a schematic side view or cross section of the zoom Z shown in FIG. 3.b along intersection line S. The shown support substrate 1 has a top side 1a and a bottom side 1b.

FIG. 3.d to 3.i illustrate the fabrication of contact pads, for instance of the first and second contact pads 91 respectively 92, by the usage of photo-lithographic techniques. It comprises the steps of coating the substrate 1 on its top side 1a with a photosensitive resist layer 2 (FIG. 3.e) and forming recesses 2a are by a photo-lithographic structuring of the applied layer 2 (FIG. 3.f). In a further step the top side 1a of the substrate 1 is coated with a layer 9 of a conductive material, for instance a metal like Au, by a PVD process like electron beam evaporation or sputtering. First electrical contact pads 91 are formed on the top side 1a of the support substrate within said recesses 2a (FIG. 3.g). The resist layer 2 is lifted off in a further step (FIG. 3.i) and the first electrical contacts pads 91 remain fixed on the top side 1a (FIG. 3.i). The distance between said first electrical contact pads 91 is determined by the dimensions of said first electronic device 61 to be mounted or by the section 1c partitioning.

The method for packaging electronic components further comprises the step of producing of at least one recess 7 in a top side 1a of said support substrate 1 by a subtractive process which is illustrated in FIGS. 3.j and 3.k. The dimensions of said recess 7 are adapted to the dimensions of said first electronic device 61 to accommodate. The dimensions of said recess 7 are chosen such that said first electronic device 61 dives completely in said recess 7. The fabrication of said recess 7 is performed by ultrasonic-lapping. The dimensions of a lap-tool or a lap-die is determined by the dimensions of the first electronic device 61 to accommodate within the produced recess 7. In one embodiment of the invention said recess 7 comprises one stair 11 at a bottom 71 of said recess 7. The dimensions of said stair 11 are determined by the dimensions of said first electronic device 61 to support and to space from said bottom 71 of said recess 7.

The fabrication of said stair 11 within said recess 7 or the fabrication of said recess 7 and said stair 11 is performed by lapping in a 2-step process using two lap-dies, in particular a first lap-die 110 and a second lap-die 111, having different dimensions according to the dimensions of said recess 7 and the dimensions of said stair 11 to produce. In a first lapping process the first lap-die 110 is used to fabricate a first recess section 72 corresponding to the diameter of the total recess 7 reduced by the length of said stair 11. The lapping process is performed up to the desired depth of the recess 7 or recess section 72. In a second lapping process a second lap-die 111 is used to increase the recess 7 diameter by a second recess section 73 to the desired recess diameter 7. Another option is based on a lapping in a 1-step process using a lap-die with a shape corresponding to the desired shape of said recess 7 and said stair 11 or the combined shape of said first lap-die 110 and said second lap-die 111.

The method for packaging electronic components comprises as an additional step the mounting or placing of one first electronic device 61 into said recess 7 (FIG. 3.*l*). For instance said first electronic device 61 corresponds to an acceleration sensor. Accordingly, said first electronic device 61 is movably mounted on said stair 11 by gluing. Said stair 11 supports and spaces said first electronic device 61 from the bottom 71 of the recess 7. Since said first electronic device 61 is mounted only at least on one of its sides, said stair 11 enables said first electronic device 61 to oscillate to detect an affecting acceleration.

Said first electronic device 61 is electrically connected with said first electrical contact pad 91 by wire bonding comprising the material Au (FIG. 3.*m*). The inventive method further comprises the covering of said top side 1*a* of said support substrate 1 with a lid 4 (FIG. 3.*n*). Said support substrate 1 is covered by said lid 4 in an adjoining relationship by means of an adhesive layer 4, in particular a glue layer, placed onto the bottom side 1*b* of said support substrate 1. According to this embodiment, the covering by said lid 4 results in a formation of a cavity 75 housing said first electronic device 61. A preferred cover comprises a glass plate having a thickness in the order of 10 μm up to some mm and a diameter corresponding essentially to the diameter of said support substrate 1 to cover. Accordingly, said top side 1*a* of said support substrate 1 and a contact side 4*a* of said covering lid 4 are bonded together by gluing. A curing of the adhesive layer 5 can be supported by irradiation. The adhesive layer 5 can be deposited by spin coating and substantially can cover entirely said contact side 4*a* of said lid 4. Said adhesive layer 5 comprises a thickness in the order of 100 nm up to some tens μm and a diameter corresponding essentially to the diameter of said lid 4.

The positioning of said first electronic device 61 within said cavity 75 enables a simplified handling of the electronic package 61 in the following process steps and an efficient protection of said first electronic device 61 e.g. against arising dust produced in the following process steps.

The method for packaging electronic components comprises as a subsequent step the providing of an electrical contact to the housed first electronic devices 61 (FIG. 3.*q* to 3.*v*). This is achieved by the fabrication of first via-holes 101 into a bottom side 1*b* of said support substrate 1 which allows an access to the first contact pads 91 to contact the first electronic devices 61.

The shown via hole fabrication uses photo-lithographic techniques with the steps of coating the substrate 1 on its bottom side 1*b* with a photosensitive resist layer 120 (FIG. 3.*p*). Recesses 120*a* are formed by a photo-lithographic structuring of the applied resist layer 120 (FIG. 3.*q*). In a further step the bottom side 1*b* of the substrate 1 is treated in a selective etching process producing said via holes 101 according to said recesses 120*a* (FIG. 3.*r*). The corresponding via-holes 91 are fabricated as deep as allowing direct access to said first electrical contact pads 91. The residual resist layer 120 is removed in a lift-off process (FIG. 3.*s*).

To establish the electrical connection from said bottom side 1*b* of said support substrate 1 to said first contact pads 91 the via holes 101 are filled up with a conducting material 105 (FIG. 3.*t*). First electrical connection lines 31 are fabricated by an evaporation process comprising Au using photo-lithographic structuring as described above for the fabrication of the first contact pads 91 (FIG. 3.*u*).

To enable an easy further processing of the resulting electronic packages 20, e.g. their mounting on a printed circuit board, first solder balls 21 are placed onto said first electrical connection lines 31 (FIG. 3.*u*). A preferred technique for the fabrication of said first solder ball 21 is the reflow technique. The first contact pads 91 and the first solder balls 21 are laterally shifted to each other. A vertical projection of the first contact pad 91 center and the first solder ball center 21 does not coincident. The vertical direction corresponds to a direction perpendicular to the top side 1*a* of the support substrate 1. FIG. 3.*w* shows the cutting or dicing of the fabricated wafer assembly. The assembly is cut along cutting lines C. Said cutting lines are positioned between said sections 1*c*. A resulting electronic package 20 is shown in FIG. 4. The electronic package 20 comprises a thickness in the order of 50 μm up to 2 mm and a diameter in the order of 500 μm up to 20 mm. It can be mounted e.g. on a non-shown printed circuit board or on another non-shown circuit substrate that for instance provides power inputs and receives instrument outputs as required by the system in which it is to be used. Since the connecting lines 31 extend essentially parallel to the back side 1*b* from the bottom side of the filling material 105 to a bottom side of a corresponding cavity 75 projection, a compact and space-saving design of the electronic package is enabled.

FIGS. 5.*a* to 5.*l* schematically show a further embodiment of the present inventive method to illustrate the process steps involving the mounting of a first and a second electronic device 61 and 62. In case that the fabrication of a second component is not explicitly explained, the fabrication of a first component described in FIGS. 3 *a* to 3.*w* can be applied also to said second component. For instance the deposition of the second electrical contact pads 92 is performed in the same manner or at least in a similar manner as the fabrication of the first electrical contact pads 91.

FIG. 5.*a* shows the support substrate 1 after the fabrication of the recesses 7 and the deposition of the first and second electrical contact pads 91 and 92. First electronic devices 61, for instance optical detectors, are positioned onto the bottom 71 of said recesses 7 (FIG. 5.*b*). Second electronic devices 62 are positioned, in particular adjacently to said recesses 7, on the top side 1*a* of said support substrate 1 (FIG. 5.*c*). In one embodiment of the present invention said second electronic device 62 is an integrated circuit. In particular said integrated circuit is provided as a controller integrated circuit for said first electronic device 61.

The electrical connection of said first electronic device 61 and said second electronic device 62 is illustrated in FIG. 5.*d*. The electrical connection 81 of the first electronic device 61 with the first electrical contact pad 91 is performed by wire bonding. The connection 82 between the second electronic device 62 and the second electrical contact pad 92 is realized by metal pasting 82. The first electronic device 61 and the second electronic device 62 are electrically connected via the connecting line 83 which can be produced also by metal pasting.

One further step for packaging electronic components corresponds to a covering of said top side 1*a* of said support substrate 1 with a lid 4 (FIG. 5.*e* and FIG. 5.*f*). Said support substrate 1 is covered by said lid 4 in an adjoining relationship via anodic bonding. A preferred cover or lid 4 is provided as a glass plate or a plate being at least transparent for the radiation to be detected by said first electronic device 61. Accordingly, the covering by said lid 4 results in a simultaneous formation of a cavity 75 housing said first electronic device 61 and an encapsulation of said second electronic device 62. The position of said first electronic device 61 within said cavity 75 and the encapsulation of said second electronic device 62 enable a simplified handling and enhanced protection of the electronic package 20 to be produced in the subsequent fabrication steps.

FIGS. 5.g and 5.j illustrate the providing of an electrical connection to the housed first electronic devices 61 and to the encapsulated second electronic device 62. The respective fabrication of the first and the second via holes 101 and 102 is illustrated in FIGS. 5.g to 5.i and corresponds to the fabrication of the first via holes 101 as shown in FIGS. 3.q to 3.s. The first via-holes 101 and the second via holes 102 allow access to the first respectively second electrical contact pads 91 and 92.

Figure 6:
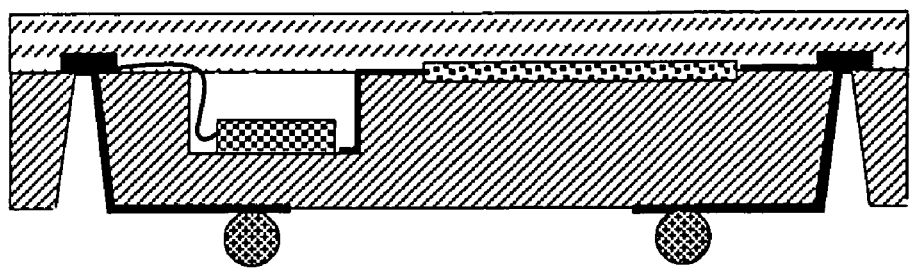
FIG. 6 schematically shows an electronic package being produced according to the method illustrated in FIGS. 3.a to 3.w.

To establish the electrical connection from said bottom side 1b of said support substrate 1 to said first respectively second contact pads 91 and 92 the respective via holes 101 and 102 are provided or equipped with first respectively second electrical connecting lines 31 and 32. Said first and second electrical connecting lines 31 and 32 can be fabricated by photolithographic structuring according to the above described fabrication of the first contact pads 91. The respective solder ball deposition and wafer dicing (FIGS. 5.k and 5.l) correspond to the solder ball deposition and wafer dicing shown in FIGS. 3.v and 3.w. The fabricated electronic package 20 after dicing is shown in FIG. 6.

Since the first electronic device 61 and/or the second electronic devices 62 are well protected by the housing within said cavity respectively the encapsulation in between the contact side 4a of the lid and the top side 1a of the substrate, a disturbance or a damage of the electronic devices 61 and 62 can be reduced or even avoided.

A method of packaging electronic devices and of packaging electronic devices with their associated integrated circuits has been shown. It will be understood that the invention may be embodied in other specific forms without departing from the spirit or central characteristics thereof. The present examples and embodiments, in particular the above mentioned materials, therefore, are to be considered in all respects as illustrative and not restrictive, and the invention is not to be limited to the details given herein. Above described sequence of method steps can be exchanged in a reasonable manner.

REFERENCES

1 Support substrate
1a Top side of the support substrate
1b Bottom side of the support substrate
1c Section of the top side 1a
2 Resist layer
2a Recess in the resist layer 2
4 Lid or cover
4a Contact side of the lid 4
5 Adhesive layer
7 Recess
9 Conductive material layer
11 Stair
20 Electronic package or chip
21 First solder ball
22 Second solder ball
31 First electrical connection line
32 Second electrical connection line
61 First electronic device
62 Second electronic device
71 Bottom of the Recess
72 First section of recess 7
73 Second section of recess 7
75 Cavity
81 Connection between first contact pad 91 and first electronic device 61
82 Connection between second contact pad 92 and second electronic device 62
83 Connection between first electronic device 61 and second electronic device 62
91 First electrical contact pad
92 Second electrical contact pad
101 First via-hole
102 Second via-hole
105 Conductive material filling
110 First lap-die
111 Second lap-die
120 Resist layer
120a Recess in resist layer 120
200 Lift-off-direction
Z Zoom
S Intersection line
C Cutting line

The invention claimed is:

1. A method for packaging electronic components comprising:
   a) providing at least one support substrate (1) comprising a layer of material selected from a group consisting of silicon, gallium arsenide, InP, SiGe, sapphire or a semiconductor having a an energy gap between 2.5 and 10.0 eV,
   b) producing at least one recess (7) in a top side (1a) of said support substrate (1) comprising one stair (11) at one side of and within the recess using a subtractive process selected from the group consisting of etching, lapping and sandblasting,
   c) placing at least one first electronic device (61) partially onto said stair (11) to space said first electronic device (61) from a bottom (71) of said recess (7); and
   d) covering at least partially said top side (1a) of said support substrate (1) with a lid (4).

2. The method according to claim 1, wherein the step of covering said top side (1a) of said support substrate (1) with a lid (4) comprises the step of forming a cavity by said recess (7) and said lid (4) housing said first electronic device (61).

3. The method according to claim 1 further comprising arranging at least one second electronic device (62) on said top side (1a) of said support substrate (1).

4. The method according to claim 1, wherein said first electronic device (61) is mounted on said stair (11) such that said first electronic device (61) is at least partially movable.

5. An electronic package (20) comprising:
   a) at least one support substrate (1) comprising a single layer of material selected from a group consisting of silicon, gallium arsenide, InP, SiGe, sapphire or a semiconductor having a an energy gap between 2.5 eV and 10.0 eV, the support having at least one recess formed in the layer (7) in a top side (1a) wherein said recess (7) comprises one stair (11) at one side of and within the recess,
   b) at least one first electronic device (61) arranged partially onto said stair (11) spacing said first electronic device (61) from the bottom (71) of said recess (7), and
   c) a lid (4) covering at least partially said top side (1a) of said support substrate (1).

6. The electronic package (20) according to claim 5 comprises a cavity which houses said first electronic device (61) and which is formed by covering said recess (7) with said lid (4).

7. The electronic package (20) according to claim 5, wherein said first electronic device (61) is mounted on said stair (11) such that said first electronic device (61) is movably mounted.

8. The electronic package (20) according to claim 5, wherein said first electronic device (61) comprises a MEMS device, a semiconductor function element, an optical function element, a thermo function element and/or a mechanical function element.

* * * * *